United States Patent [19]
Frederick

[11] Patent Number: 5,195,232
[45] Date of Patent: Mar. 23, 1993

[54] METHOD OF MAKING ELECTROMAGNETIC INTERFERENCE FILTERS

[75] Inventor: W. Richard Frederick, Mundelein, Ill.

[73] Assignee: Integrated Power Components Inc., Mundelein, Ill.

[21] Appl. No.: 760,696

[22] Filed: Sep. 16, 1991

Related U.S. Application Data

[63] Continuation-in-part of Ser. No. 460,573, Jan. 3, 1990, Pat. No. 5,083,101.

[51] Int. Cl.$^5$ .............................................. H01F 7/06
[52] U.S. Cl. .................................... 29/602.1; 29/855
[58] Field of Search .................... 29/592.1, 602.1, 606, 29/855, 25.42; 333/177–181, 12, 184, 185; 336/212, 221, 229, 233; 361/328, 306–310

[56] References Cited

U.S. PATENT DOCUMENTS

| | | | |
|---|---|---|---|
| 4,559,699 | 12/1985 | Owen et al. | 29/602.1 |
| 4,633,368 | 12/1986 | Frederick | 29/25.42 |
| 4,694,140 | 9/1987 | Wheeler | 219/132.1 |
| 4,930,200 | 6/1990 | Brush, Jr. et al. | 29/25.42 |
| 5,028,739 | 7/1991 | Keyser et al. | 29/592.1 X |
| 5,056,214 | 10/1991 | Holt | 29/602.1 |
| 5,084,802 | 1/1992 | Nguyenngoc | 29/842 X |
| 5,093,979 | 3/1992 | Kwapisz | 29/602.1 |

*Primary Examiner*—Timothy V. Eley
*Attorney, Agent, or Firm*—Arnold, White & Durkee

[57] ABSTRACT

A method of assembling an electromagnetic interference filter comprises the step of disposing electrical components on a base. The components are connected to form an electromagnetic interference filter. The filter is enclosed in a metal case, which is formed by folding a metal sheet around said filter and joining the ends of the sheet together. The metal sheet has an insulating coating disposed on one side to prevent contact between the filter components and the case. The outer surface of the case is sealed with seal tape.

27 Claims, 8 Drawing Sheets

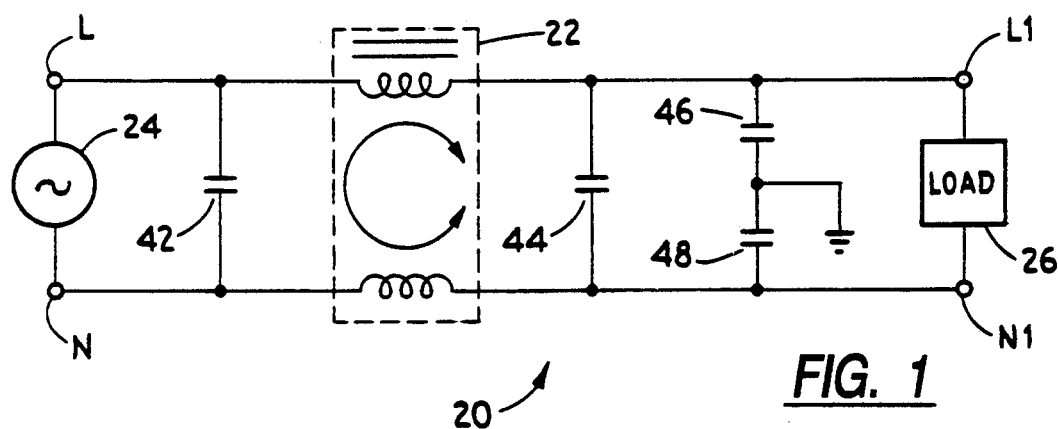
FIG. 1
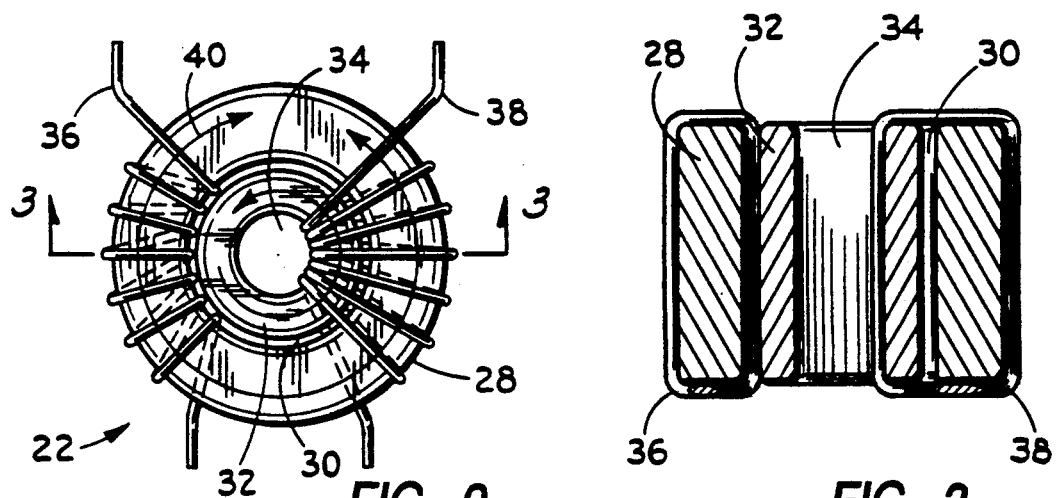
FIG. 2
FIG. 3
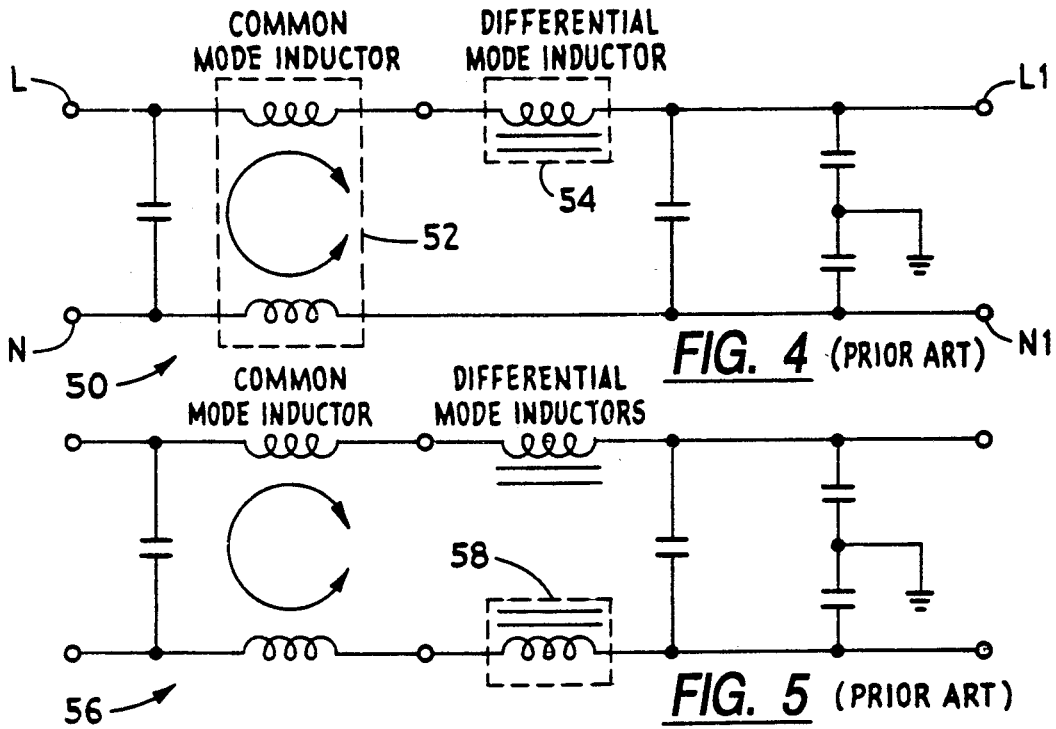
FIG. 4 (PRIOR ART)
FIG. 5 (PRIOR ART)

METHOD OF MAKING ELECTROMAGNETIC INTERFERENCE FILTERS

REFERENCE TO RELATED APPLICATION

This application is a continuation-in-part of U.S. application Ser. No. 07/460,573 filed Jan. 3, 1990, now U.S. Pat. No. 5,083,101.

FIELD OF THE INVENTION

This invention relates to electronic components and, more particularly, to a method of assembling EMI power line filters in an improved shielded case, and with an improved assembly fixture and, if desired, with an integrated filter inductor which combines a differential mode noise inductor and a common mode noise inductor into a single electronic component.

BACKGROUND OF THE INVENTION

Electronic equipment employing digital techniques, such as computing devices, and other electronic or electrical equipment such as switching power supplies cause electromagnetic interference (EMI) which can both be radiated and conducted. EMI conducted over the power leads for the equipment occurs in a common mode and in a differential mode. Most of the conducted EMI is present as the common mode voltage which is measured with respect to both the line and the neutral conductors relative to ground. The differential mode conducted EMI is measured as a voltage between the line and the neutral conductors.

Designers and users of such equipment must be concerned with suppression of conducted EMI or noise because the noise can interfere with proper operation of other equipment which could be necessary to health and safety. Furthermore the U.S. Federal Communications Commission (FCC) and others have established regulations and standards regarding EMI emissions. For example, FCC Rules, Part 15, Subpart J concerns reduction of the interference potential of electronic computing devices. It is also desirable to protect equipment from outside noise, and to attenuate conducted noise without regard to its source.

It is known to place a power line interference filter between the power source and the equipment causing the EMI. Such a filter includes a common mode inductor having a core of permeable material with two windings, one winding part of the line conductor and the other winding part of the neutral conductor, and a differential mode inductor wound in one or both of the line and neutral. Such a filter also typically includes a first differential mode capacitor connected across the line and neutral between the common mode inductor and the power source, a second differential mode capacitor connected across the line and neutral between the inductors and the equipment, and a common mode capacitor connected from each of the line and neutral to ground. This filter arrangement requires 6 or 7 discrete components and a considerable amount of wire length which could either radiate EMI or receive radiated EMI. This is, in essence, a low pass filter. The impedance associated with the power source is relatively low, and at 60 Hz the impedance of the filter essentially matches that of the power source. However, at frequencies in the range of 10 kHz to 30 MHz and above generally associated with common mode noise, and frequencies of 10 kHz to 500 kHz generally associated with differential mode noise, the filter acts as an impedance mismatching network to prevent conduction at those high frequencies. Such a filter is also useful in D.C. applications, such as in a D.C. to D.C. converter, where the converter noise can propagate down the D.C. busses so as to adversely affect other components of the system.

From U.S. Pat. No. 3,170,133 it is known to provide a transformer with inner and outer core sections. The outer core section defines a window and has an air gap, and the inner core section is nested within the outer. The first and second windings of the transformer are wound about the cross sections of both core sections, the concept being that for lower values of exciting current, the resulting magnetic flux would tend to concentrate in the inner core which would saturate at predetermined values of exciting current above which the additional magnetic flux would concentrate in the outer core section. Additional windings are shown only about one of the core sections for testing purposes to permit determination of the magnetic characteristics of the individual core sections.

SUMMARY OF THE INVENTION

Among the several aspects and features of the present invention may be noted the provision of an assembly method for an EMI filter which incorporates a common mode inductor and a differential mode inductor into a discrete component. The inductor generates less heat and requires less wire than conventional inductors. Additionally, the integrated inductor requires fewer turns resulting in less emitted and received radiated noise than conventional inductors. Furthermore, the filter can incorporate a multiple function integrated capacitor which reduces the number of discrete electronic components needed for the filter to only three, making for a small envelope for the filter components. The filter constructed according to the method of the present invention has long service life, is reliable in use, and is relatively easy and economical to manufacture.

Accordingly, it is a primary object of this invention to provide a method of assembling an electromagnetic interference filter for electronic equipment from compact, high-performance, cost-effective components.

It is another important object of this invention to provide such a method that minimizes intermediate splice connections between various filter components.

A further object of this invention is to provide such a method that employs a multiple function integrated capacitor and a single inductor component having both a common mode inductor and a differential mode inductor integrated into one discrete package.

Yet another object of this invention is to provide such a method to produce a filter of optimized geometry for minimizing the package size.

Briefly, the assembly method of the present invention includes the steps of disposing electrical components on a base. The components are connected to form an electromagnetic interference filter. The filter is enclosed in a metal case, which is formed by folding a metal sheet around said filter and joining the ends of the sheet together. The metal sheet has an insulating coating disposed on one side to prevent contact between the filter components and the case. The outer surface of the case is sealed with seal tape.

Other aspects and features of the present invention will be, in part, apparent and, in part, pointed out specifically in the following specification and accompanying drawings.

BRIEF DESCRIPTION OF THE DRAWINGS

FIG. 1 is an electrical schematic diagram of an electromagnetic filter assembly embodying various aspects of the present invention including an integrated inductor forming both a differential mode noise inductive element and a common mode noise inductive element;

FIG. 2 is a plan view of the integrated inductor of FIG. 1;

FIG. 3 is a sectional view of the integrated inductor taken generally along line 3—3 of FIG. 2;

FIGS. 4 and 5 are electrical schematic diagrams of prior art electrical filter assemblies;

Corresponding reference characters indicate corresponding components throughout the several views of the drawings.

DETAILED DESCRIPTION OF THE INVENTION

Figure 6:
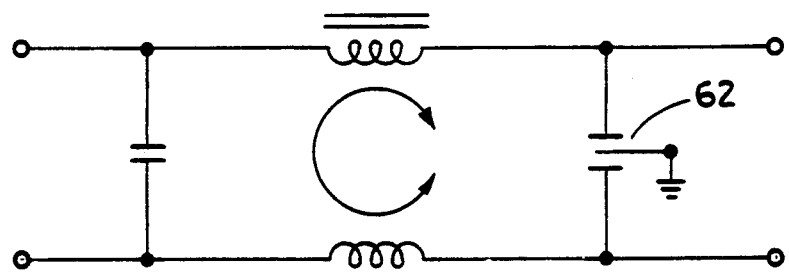
FIG. 6 is an electrical schematic diagram of an alternative embodiment of the electromagnetic filter assembly of the present invention including a multiple function integrated capacitor.

Referring now to the drawings, an electromagnetic filter assembly including an integrated inductor 22 is generally indicated in FIG. 1 by reference numeral 20. The filter assembly 20 is for interconnection between a low frequency A.C. power source 24 (and also a D.C. power source) and electronic, electrical or electromechanical equipment 26, such as a device employing digital techniques or a switching power supply, the operation of which results in EMI. The inductor 22, as shown in FIG. 2, includes an outer core 28 of permeable material defining an outer window 30. An inner core 32 of permeable material is disposed in the outer window 30 and defines an inner window 34. A first power lead 36 which is connected to the lead N of the power source 24 is wound in one direction about the cross section of only the outer core 28. A second power lead 38 which is connected to the lead L of the power source is wound in the opposite direction about the cross sections of both the inner core 32 and the outer core 30, as also shown in FIG. 3. The outer core 28 is the common mode noise core and, as the two windings are wound in opposite directions, the magnetic lines of force resulting from the two windings tend to cancel each other (are balanced) as indicated by the two-headed arrow 40 so that it is unlikely that the core 28 will saturate. More specifically, the magnetic force lines which balance are those resulting from the "power current" going in opposite directions through the two windings. The common mode noise is traveling in the same direction in each winding, creating magnetic force lines which do not balance but are attenuated. However, the common mode noise is in the microamp range and does not cause saturation of the core. The inner core 32 is the differential mode core and provides an entirely different magnetic path for the magnetic lines of force resulting from the differential mode noise.

The filter assembly 20 also includes a first differential mode capacitor 42 connected across the power source leads L and N between the inductor 22 and the power source 24, and a second differential mode capacitor 44 connected across the power source leads L1 and N1 to the equipment or load 26 between the inductor 22 and the load. The filter assembly further comprises a first common mode capacitor 46 connected between lead L1 and ground, and a second common mode capacitor 48 connected between lead N1 ground.

A prior art electromagnetic filter assembly 50 is shown in FIG. 4. This filter assembly has a common mode inductor 52 including a core about which is wound in opposite directions power leads connected to the power supply leads, respectively. Filter assembly 50 also includes a separate differential mode inductor 54 including a core and a power lead winding connected in series with a power lead winding of the common mode inductor 52 between leads L and L1. As the differential mode electromagnetic interference is present as a voltage between the line and neutral leads, it makes no difference whether the winding of the differential mode inductor is interconnected with the line lead or the neutral lead. FIG. 5 shows another prior art electromagnetic filter assembly 56 identical to assembly 50 except including a second differential mode inductor 58 interconnected with the neutral lead. This second differential mode inductor may be needed if the requirements of the application would cause the core of the first differential mode inductor to saturate. However, the second inductor 58 is most often added because of the economics of scale. That is, as more turns are added, the core window must be enlarged. This results in a longer magnetic path which is less efficient, requiring more turns. Thus, it may be more efficient to use the two inductors for ease of manufacture. It will be appreciated that these prior art filter assemblies require numerous discrete electronic components and substantial wiring.

More specifically, in the inductor 22 of the present invention shown in FIGS. 1-3 the outer core 28 has a permeability of preferably at least about 4500. A preferred material for the outer core is ferrite. The inner core 32 preferably has a permeability of at least about 70, and a preferred material is powdered iron. Each of the power leads 36 and 38 have substantially the same number of turns which is preferably in the range of 30 to 60.

Referring now to FIG. 6, an alternative embodiment of the filter assembly of the present invention is indicated by reference numeral 60. The filter assembly 60 is identical to filter assembly 20 except that capacitive elements corresponding to the second differential mode capacitor 44, the first common mode capacitor 46, and the second common mode capacitor 48 have been incorporated into a multiple function integrated capacitor 62, shown in FIG. 7. A partially completed winding 64 or body of the capacitor is shown in FIG. 8. The winding has a pair of ends 66, 68 and includes a first, a second and a third insulating layer (70, 72 and 74, respectively) extending substantially from one winding end 66 to the other winding end 68. A first electrode 76 which is disposed between layers 70 and 72 extends to winding end 68 but not to end 66. A second electrode 78 which is located between layers 72 and 74 terminates short of both winding ends with one lateral edge 80 of the electrode 78 in approximate alignment with the inset edge of the electrode 76. The capacitor 62 includes a third electrode 82 positioned on the outside surface of the third layer 74 starting at the winding end 68 and terminating short of the winding end 66, preferably in general registration with the corresponding edge 84 of the electrode 78.

Electrical contact is made with the first electrode 76 and the third electrode 82 by providing a conductive covering, i.e., schooping, the winding ends 66 and 68. A conductive tab 86 contacts the second electrode 78 near the middle of its length with the tab having two insulated portions, one portion 88 located at the passage of the tab through the winding end 68 to prevent formation of a conductive path between the second electrode 78 and third electrode 82. The second portion is at the passage of the tab through the winding end 66 to prevent formation of a conductive path between the electrode 78 and the first electrode 76. It will be appreciated that the capacitor 62 integrates a trio of capacitive elements. The first and third electrodes 76, 82 form the plates of a first or X capacitor (e.g., differential mode capacitor 44) while the second and third electrodes 78, 82 and the first and second electrodes 76, 78 form the respective plates of a second and third capacitor (Y capacitors, e.g., common mode capacitors 46 and 48).

Figure 9:
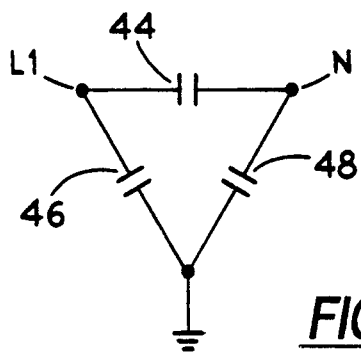
FIG. 9 is a schematic diagram of a delta capacitor circuit including an X capacitor and two Y capacitors.
Figure 10A:
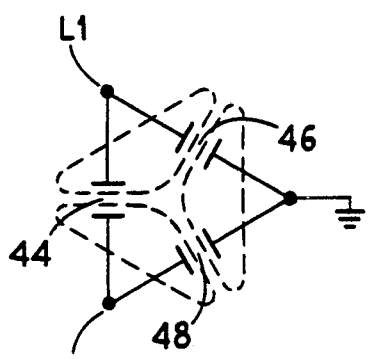
FIGS. 10A and 10B illustrate the equivalence of the multiple function capacitor and three discrete capacitors in a delta configuration.
Figure 10B:
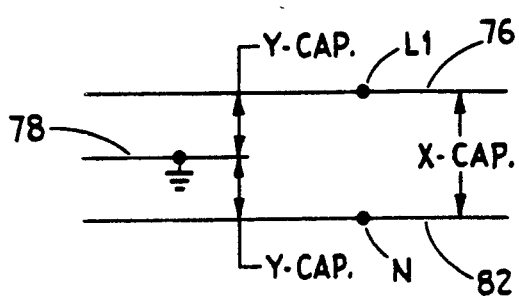

The capacitor 62 is particularly useful in the delta capacitor circuit shown in FIG. 9, which is the configuration of capacitors 44, 46 and 48. In this arrangement, the X capacitor 44 is connected between line L1 and neutral N1. The Y capacitors 46, 48 are connected from L1 to ground and from N1 to ground, respectively. The equivalence of a delta circuit, using three discrete capacitors, to the capacitor 62 with the electrode 78 grounded, the electrode 76 connected to L1, and the electrode 82 connected to N1 is illustrated schematically in FIGS. 10A and 10B. The electrode 76 functions as a plate of capacitor 46 and a plate of capacitor 44. The electrode 78 performs the duties of a plate of capacitor 46 and a plate of capacitor 48. Finally, the electrode 82 is the equivalent of respective plates of capacitors 44, 48.

Figure 7:
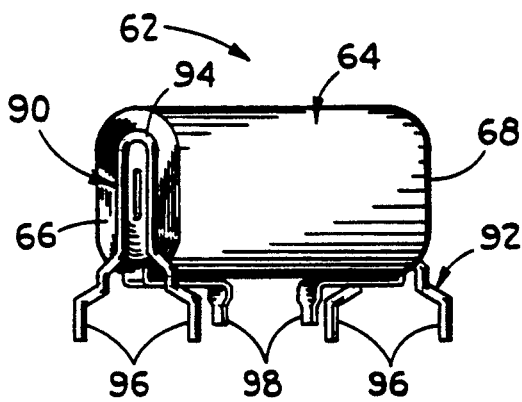
FIG. 7 is a perspective view of the multiple function integrated capacitor of FIG. 6.
Figure 8:
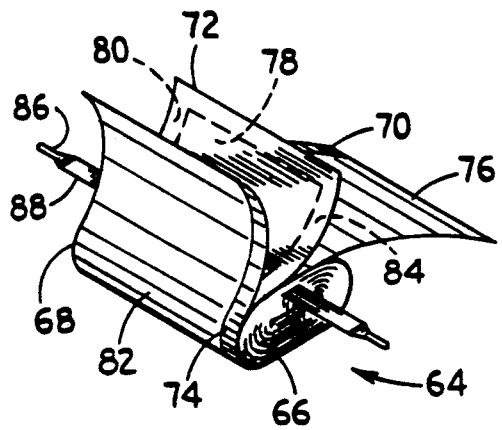
FIG. 8 is a perspective view of the winding of the multiple function integrated capacitor.

As shown in FIG. 7, the capacitor 62 also includes U-shaped leads 90, 92 fused to the respective schooped ends 66, 68 of the winding 64 for electrical connection to electrodes 76, 82, respectively. More specifically, each lead includes a bright portion 94 welded or soldered to a respective winding end, and a pair of parallel legs 96 extending away from the winding 64 generally parallel to tab ends 98. For further information concerning the structure and operation of this multiple function capacitor, reference may be made to U.S. Pat. No. 4,633,368, the teachings of which are incorporated herein by reference. However, it is contemplated that in the present filter application, the U-shaped lead be eliminated. A portion of each inductor lead can be tinned and welded to the cap ends (as are the U-shaped leads) to provide a more efficient connection.

The integrated inductor 22 combines a differential mode noise inductor and a common mode noise inductor into a single structure which significantly attenuates both common mode and differential mode EMI conducted emissions from electrical, electronic and electromechanical equipment. When the inductor 22 is used in the filter assembly 60, including the multiple function capacitor 62, the number of separate electronic components needed to form the assembly is reduced to only three. The filter assemblies 20 or 60 can be combined into a package and mounted at or near the power entry point or bulkheaded into the equipment, or they can be mounted on the power supply printed circuit board usually near the power entry point.

When compared to filters constructed from discrete components, the technology allows packaged filters with fewer components, fewer inductor turns and smaller, less expensive cores. The filters of the present invention can be produced cheaply and efficiently when constructed according to the novel method of making set forth hereinafter. Filters constructed according to the method of the present invention occupy less space on the printed circuit board than conventional filters because the components may be stacked on top of each other before the finished filter is potted rather than placed side by side on the circuit board.

The assembly method of the present invention minimizes splice and solder connections. As will be seen, a filter assembled in accordance with the method of the present invention requires significantly fewer connections than conventional filters, which typically require about eighteen connections and ten inches of seam soldering.

As previously noted, the construction of the filter is greatly simplified by employing the multiple function integrated capacitor 62. The conductive tab 86 on the multiple function integrated capacitor 62 provides a connection point for the ground lead of the filter. This point may also be used to ground the case of the filter, as will be described hereinafter.

It should be noted that a capacitor constructed according to the principles set forth in U.S. Pat. No. 4,633,368 or U.S. patent application Ser. No. 07/626,263 may be desirably used for the first differential mode capacitor 42. While the capacitor 42 is not a multiple function integrated capacitor, the physical structure of the capacitors constructed in this manner lends itself well to the assembly method of the present invention.

The first differential mode capacitor 42 and the multiple function integrated capacitor 62 are desirably unencapsulated and leadless during assembly of the filter. The entire filter is potted when assembly is complete. The use of leadless unencapsulated capacitors has several advantages. The material and labor cost of adding radial leads and cases to the capacitors is saved, reducing the cost of the completed filter assembly. Also, it is commonly known that capacitor leads introduce undesirable stray inductance in series with the capacitor to form a series resonant circuit with the capacitor at higher frequencies. It should be noted, however, the benefit of using leadless capacitors for the first differential mode capacitor 42 is not as great as the benefit obtained from using them for the multiple function integrated capacitor 62. This is true because the first differential mode capacitor 42 is used only for differential noise attenuation. Differential noise is not significant at frequencies above 1 MHz, where series resonance from the undesirable stray inductance would occur.

The assembly method of the present invention eliminates the need to splice between the common mode and differential mode inductors. In fact, by using unencapsulated leadless capacitors, splice connections between the input and output of the filter may be totally eliminated. This "continuous conductor" strategy reduces labor cost and improves reliability by reducing the number of connections. Thus, trim waste, a potential cause of short circuits in electronic components, is minimized. Reliability of the finished filter is improved.

The present method of assembling electromagnetic interference filters is much easier than conventional assembly methods. Most packaged filters are presently assembled from discrete components inside pre-formed drawn cases. Covers are seam-soldered in place after assembly. Assembling electronic components in the confines of a drawn case is difficult, time-consuming, and presents significant opportunity for error. Additionally, excess solder or wire waste can cause reliability problems with the finished filter.

The assembly method of the present invention allows assembly of electrical components in an open-air environment. After solder connections are made, the completed filter assembly may be placed inside a case. This method reduces the opportunities for assembly error and results in a filter that is much more compact than previously possible. Because components of the filter are assembled outside the case, rather than in the confines of a drawn can, the assembly method of the present invention is easily adapted to automated assembly operations, such as assembly by computer-controlled robots.

Figure 11A:
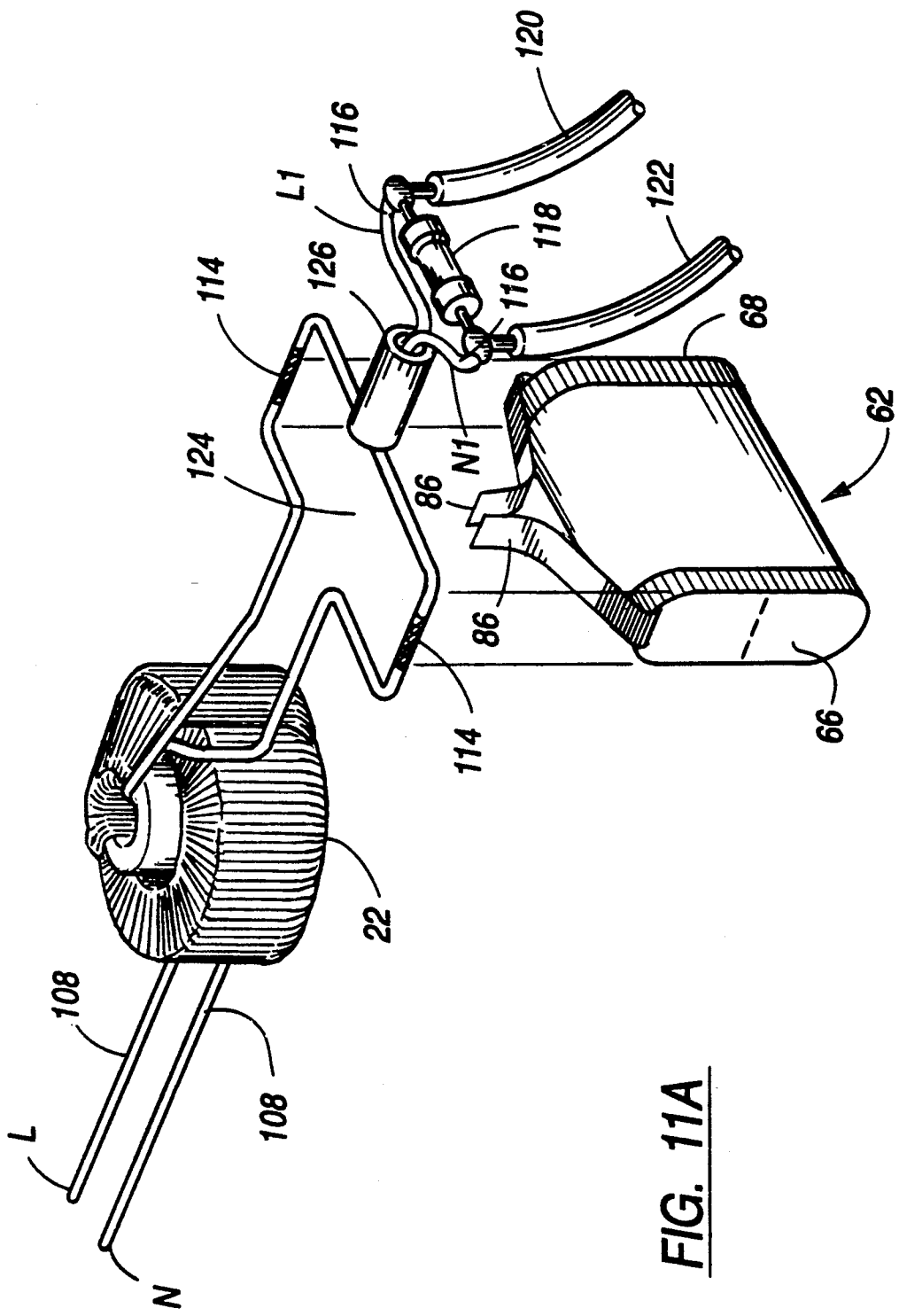
FIGS. 11A, 11B and 12 are exploded views of portions of a filter constructed according to the method of the present invention.
Figure 11B:
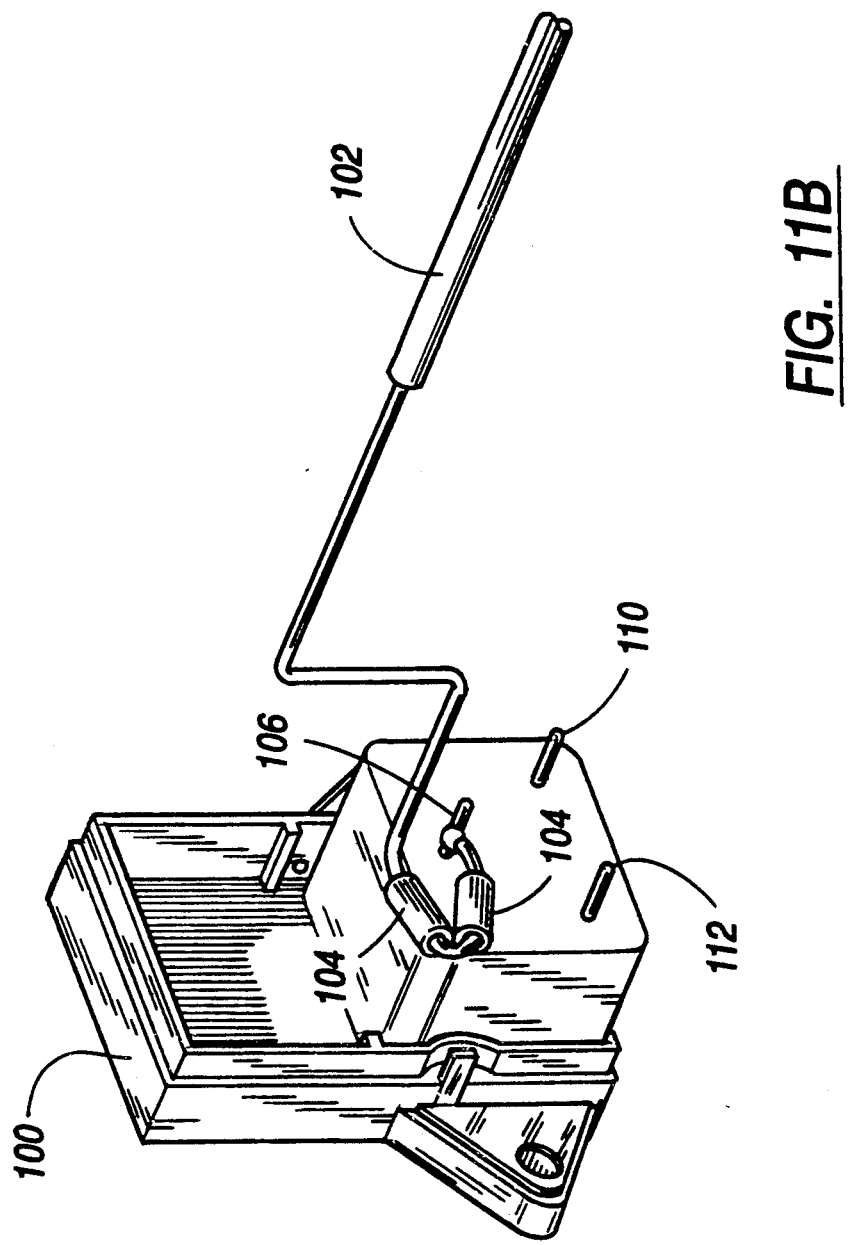

FIG. 11A and FIG. 11B are useful in explaining the assembly method of the present invention. Referring to FIG. 11B, a three-conductor socket 100 is used to provide support for the filter assembly and to allow the filter assembly to be connected to the electronic equipment to be protected. The socket 100 is desirably constructed according to IEC standards. A metal flange 101 may be desirably mounted on the socket 100. The flange 101 is slightly raised with respect to the surface of the socket 100 to make a secure ground connection with the bulkhead to which the filter is attached. The socket may further include a ground tab 103 mounted flush with the socket so as not to interfere with the seal between the case and the socket 100. The ground tab 103 may also help to secure the case to the socket by engaging a dimple stamped in the case.

A ground conductor 102 is cut to a predetermined length and predetermined lengths of insulation are stripped from each end. One or more one-turn bead cores 104 may be slipped over a first end of the ground conductor 102, which is then electrically and mechanically secured to a ground terminal 106 on the socket 100. A multiple-turn ground inductor or no beads and a straight wire connection could be used instead of the single-turn bead cores 104. As will become apparent, the ground conductor 102 makes a continuous path from the ground terminal 106 through the filter and includes a mechanically secure safety ground connection at the socket and an electrical EMI shield connection to the case.

Bead inductors on ground terminals have been used in a limited way in the prior art. Because the beads are electrically in series with the main inductor for the common mode noise return path to the system noise source, they extend the range of the main coil. Typically, bead inductors are placed over a solid wire g lead going to a post in the case resulting in one or more additional connections compared to this continuous conductor technology.

Next, an inductor assembly, shown in FIG. 11A, is constructed. A fixture or automated assembly equipment (not shown) may be desirably employed to form the rectangular channel 124 and to hold the inductor 22, bead 126, resistor 118 and leads 120 and 122 in place during construction of the inductor assembly; however, the use of such a fixture is not an essential element of the invention. Capacitor 62 is shown in FIG. 11A to show its relationship to the inductor assembly during final assembly but it is not part of the inductor assembly at this time. One method of forming the inductor assembly is as follows.

The L and N leads of the inductor 22 are trimmed to a predetermined length. Three areas on each of the L and N leads are exposed and tinned (for example, by applying solder). Tinning regions 108, 114 and 116 can be done before or after construction of this inductor assembly. A method in which tinning is done prior to construction of the inductor assembly will be described for illustration. A first tinned area 108 on the L lead will allow connection of the L lead to an L terminal 110 on the socket 100. A first tinned area 108 on the N lead will allow connection of the N lead to an N terminal 112 on the socket 100. The first tinned areas 108 on the respective conductors additionally allows electrical connection to the ends of the first differential mode capacitor 42 (see FIG. 12), as will be described hereinafter. A second tinned area 114 on each of the L and N leads allows electrical connection to the sides 66, 68 of the multiple function integrated capacitor 62 at a later time, as will be described. A third tinned area 116 is employed for connecting a bleeder resistor 118 across the L1 and N1 leads and for connecting the L1 and N1 leads to conductors 120 and 122, which connect the finished filter to the equipment to be protected. As is commonly known, the bleeder resistor 118 provides a discharge path for the capacitors 42 and 62 when power is removed from the protected equipment.

The conductor 120 is used to connect the L1 lead to the protected equipment, and the conductor 122 is used to connect the N1 lead to the protected equipment. It will be apparent to one of ordinary skill in the art that up to ten splice connections may be eliminated by making the electrical connections at the tinned regions as described.

After the tinned regions are prepared, but prior to making any solder connections, the L1 and N1 leads are formed into a generally rectangular channel 124 dimensioned to receive the multiple function integrated capacitor 62. The channel 124 is formed by bending each of the L and N leads of the inductor 22 in a U-shape. Additionally, a single turn bifilar wound bead 126, if desired to improve high frequency performance between 5-300 MHz, may be slipped over the L1 and N1 leads.

The third tinned area 116 of the L1 lead is twisted with the conductor 120 and one end of the bleeder resistor 118. Excess wire is desirably trimmed before the connection is soldered. Similarly, the third tinned area 116 of the N1 lead is twisted with the conductor 122 and the other end of the bleeder resistor 118. Excess wire is trimmed and this connection is soldered.

Figure 12:
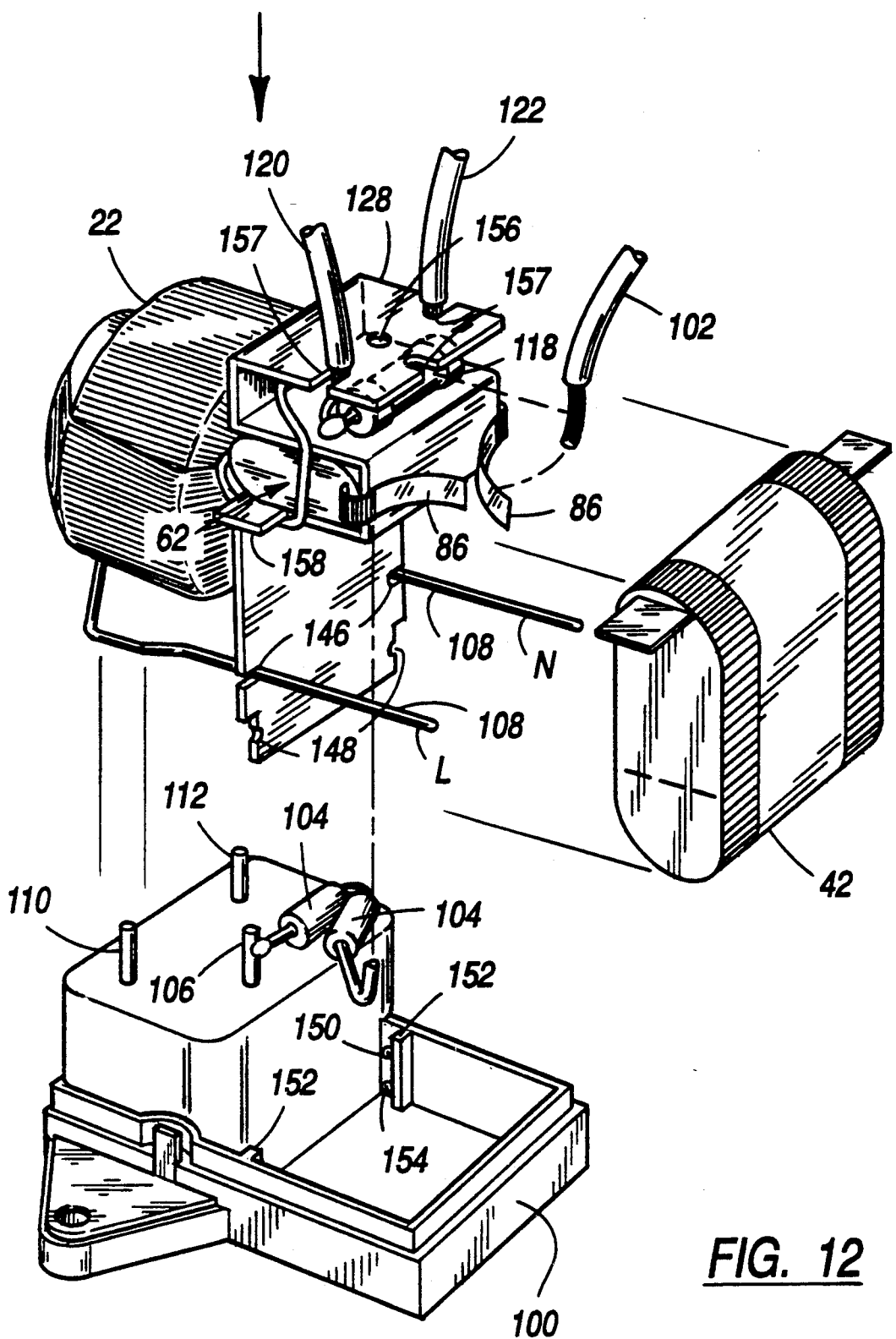

Referring now to FIG. 12, the inductor assembly may be folded and inserted into a pre-formed insulating assembly fixture 128, which facilitates the assembly operation and separates the filter components. The specific configuration of the insulating assembly fixture 128 may be varied from the particular configuration illustrated, but is desirably configured to minimize the space occupied by the filter components. As shown in FIG. 12, the capacitor 62 desirably snaps into place in a separate compartment in the insulating assembly fixture 128. Similarly, a separate compartment is formed to hold the bleeder resistor 118 and the bead 126. This is to minimize the possibility of shorting between the components. The insulating assembly fixture 128 includes grooves 146 to hold the L and N leads apart from other filter components (as well as each other) to prevent shorting of other components to the first tinned areas 108 of either lead, or between the L and N leads themselves. The grooves 146 also ensure that the L and N leads of the inductor 22 are disposed to contact the ends of capacitor 42 in uniform positions.

The fixture 128 may also include notches 148 which cooperate with detent dimples 150 on the socket 100 to form a detent stop when the fixture 128 is brought into engagement with the socket 100. The socket 100 may also include a pair of tabs 152, which form notches 154 to receive the fixture 128. The fixture 128 may have an aperture 156 disposed therein to facilitate the flow of potting material into the compartment containing the bleeder resistor 118 and the bead 126. The fixture 128 may have groves 157 which hold leads 120, 122 and 102 to assure part placement for uniform EMI performance and hold the assembled components mechanically in place during the rest of the filter assembly operation. Finally the fixture 128 has lips 158 which hold the tinned areas 114 in proper position for soldering to the capacitor ends 66 and 68.

Next, the first tinned area 108 of the N conductor is soldered to the L terminal 110 of the socket 100 and the first tinned area 108 of the N conductor is soldered to the N terminal 112. The ground conductor 102 is then connected (for example, by soldering) to the conductive tabs 86 of the capacitor 62. A length of the conductive tab 86 should be left perpendicular to the body of the capacitor 62 to allow the conductive tab 86 to be grounded to the case of the filter. The first differential mode capacitor 42 is connected (for example, by resistive welding or soldering) between the first tinned areas 108 of the L and N conductors. The ends 66 and 68 of the multiple function integrated capacitor 62, which was previously snapped into place in the assembly fixture 128, is connected (for example, by resistance welding or soldering) to the tinned areas 114 held in proper placement by the lips 158.

As previously noted, the assembly method of the present invention is easily adapted to robotic assembly both in the fabrication of the inductor assembly FIG. 11A and the final assembly of this inductor into the assembly fixture 128 and the assembly of this fixture 128 with the socket 100 and capacitors 42 and 62.

Figure 13:
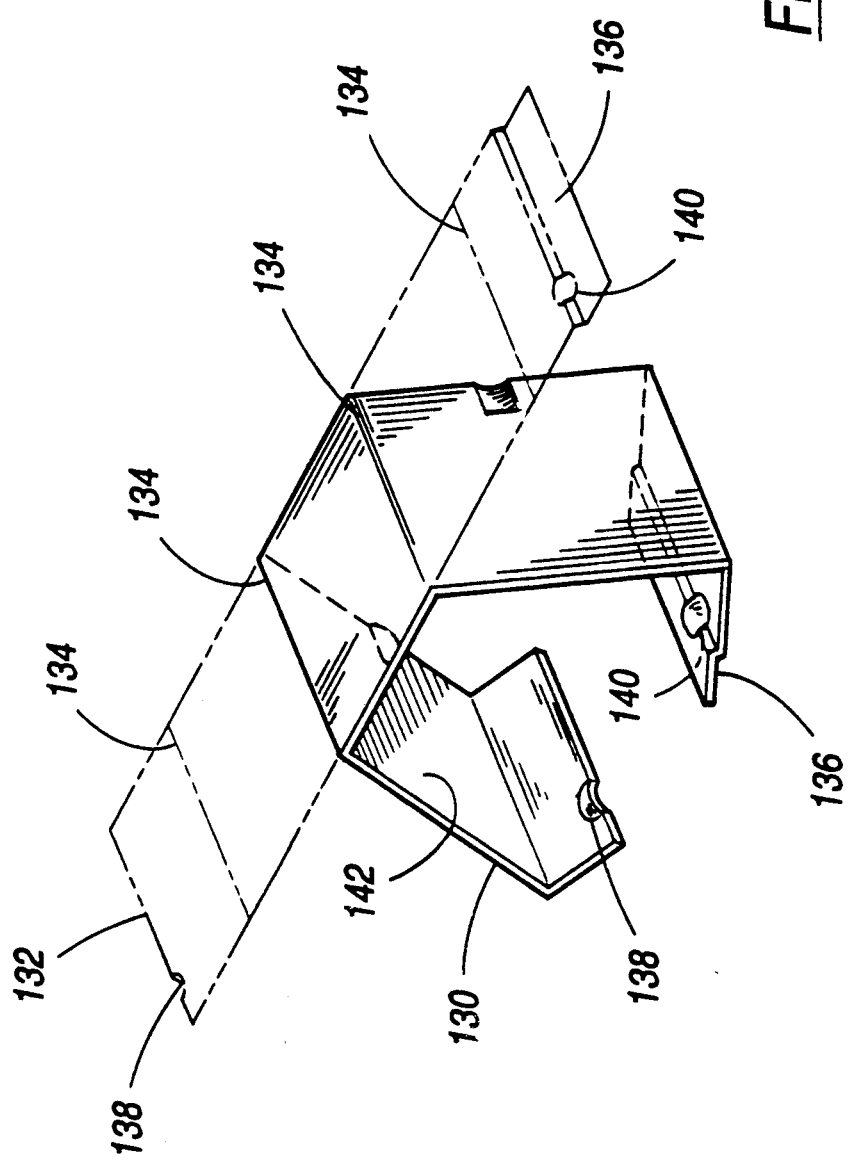
FIG. 13 is a perspective view of a case for use in constructing a filter according to the method of the present invention.

FIG. 13 shows a case 130 for containing the completed filter assembly. The case 130 is formed, for example, from pre-plated steel sheet roll having a width equal to the length of the desired case and having a thickness of about 0.020". Because the case is used as a system ground, it is desirably laminated with an insulated coating 142 on its inner surface to insulate the filter assembly. The insulating coating 142 is desirably disposed on the case material by feeding insulating tape of the same width as the steel roll through a roller with the uncut case material. The laminated case material is then cut to the proper length. The pre-slit to width case material is cut to length and stamped with the required lip 136 and dimples 138 and 140 in a single operation by conventional methods. Bend lines 134 are desirably provided at predetermined locations to allow the case 130 to be secured around the filter assembly. These bends are preferably formed by pushing the flat case laminate through a series of plows and rollers. By moving the location of the plows and rollers cases of different sizes can easily be formed in the same production equipment. A lip portion 136 is desirably stamped into the case 130 so that the ends will join to form a flush seam. Additionally, dimpled portions 138, 140 are stamped in the case to allow the ends to be snapped closed prior to being secured. Phantom lines 132 show the case after it has been stamped, but prior to being bent to enclose the filter assembly.

Figure 14:
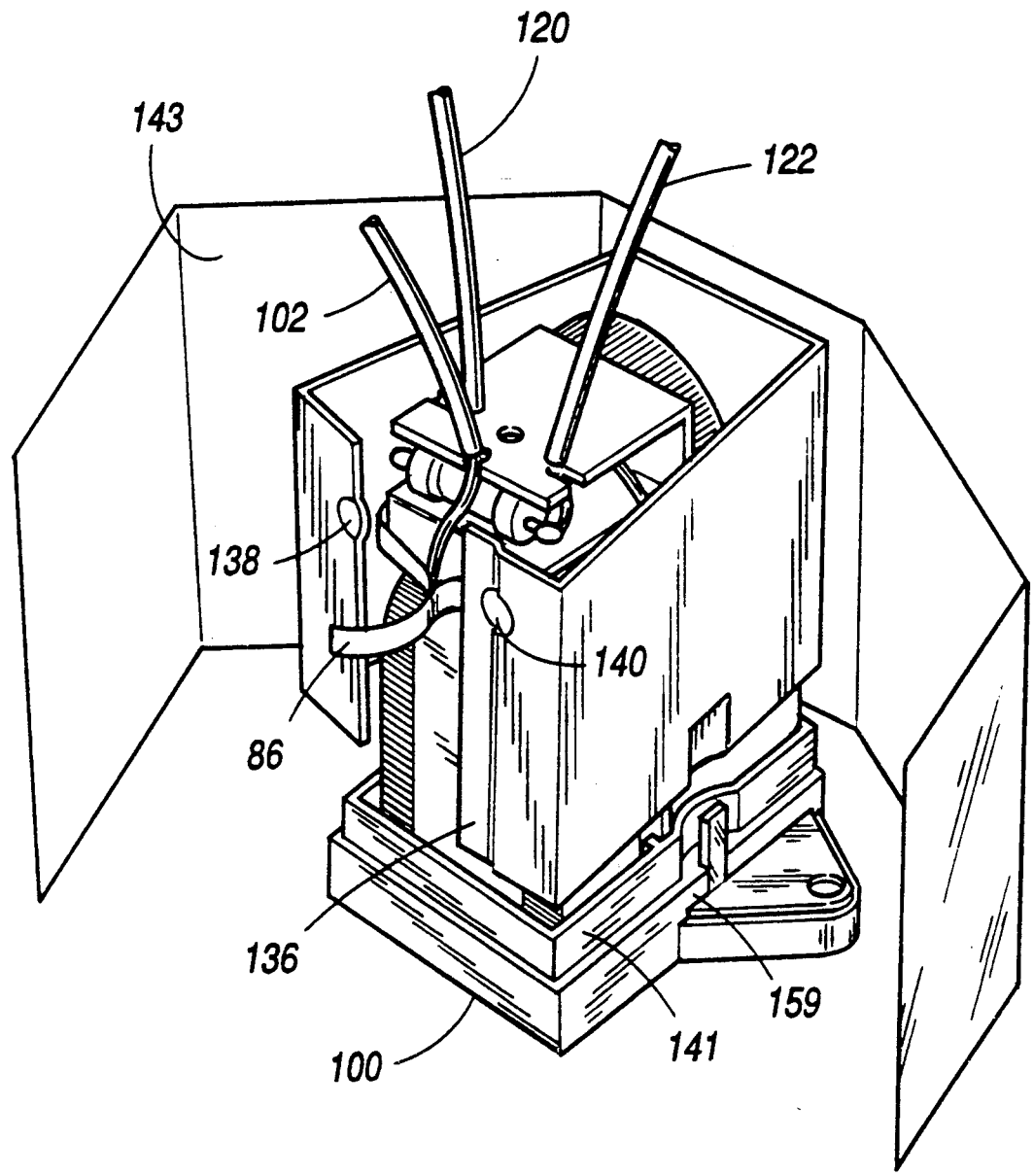
FIG. 14 is a perspective view showing the installation of the case on a filter constructed according to the method of the present invention.

In FIG. 14, the case 130 is folded partially around the completed filter assembly. It should be noted that the case is dimensioned to seal on a lip 141 of the socket 100. The conductive tab 86 of the multiple function integrated capacitor 62 is fed between the dimpled portions 138 and 140 before they are snapped together. When the dimpled portions are soldered together, the conductive tab 86 will be securely connected to the case 130. Thus, this solder connection serves the dual purpose of securing the case 130 and grounding the filter to the case 130. Additionally, the appearance of the case 130 is improved by soldering the case 130 at the dimpled portion 138 because the solder will be contained in the dimpled portion 138 and will not form a bump on the surface of the case 130.

Figure 15:
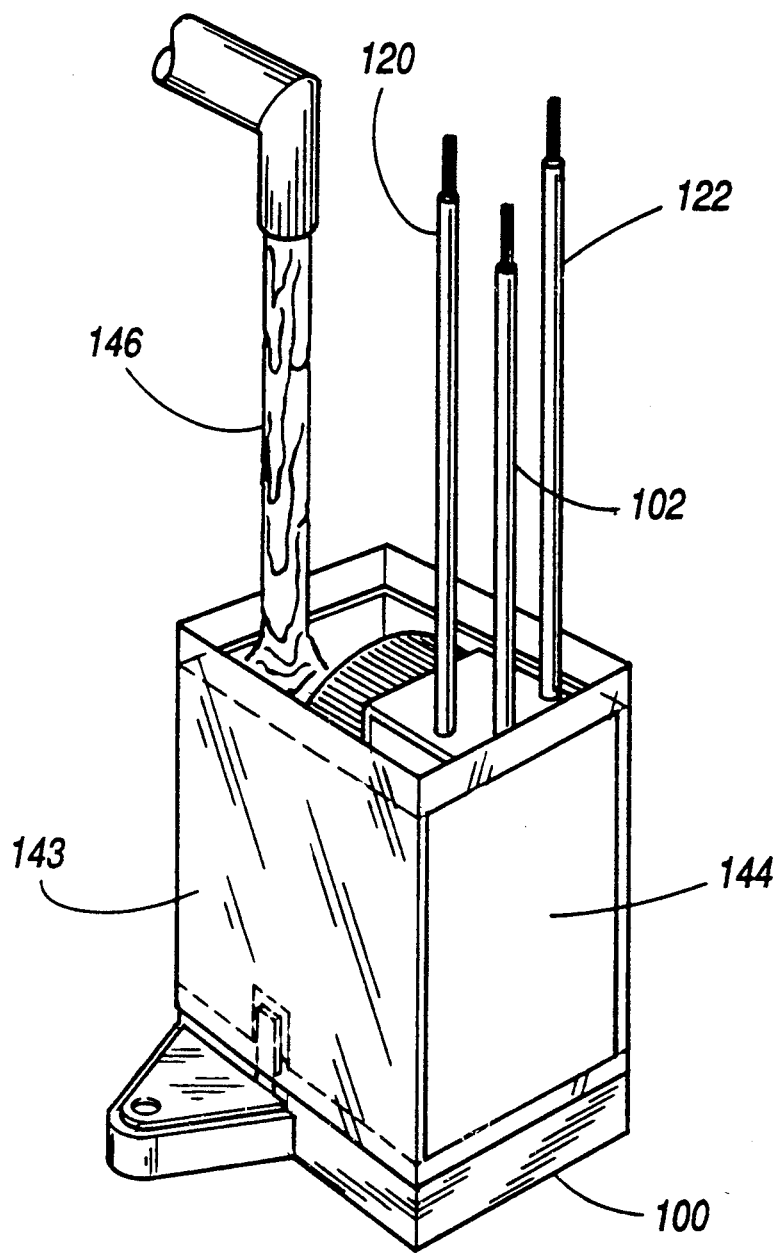
FIG. 15 is a perspective view showing the application of potting compound to a completed filter constructed according to the method of the present invention.

A protective seam seal tape 143 is then secured to the outer surface of the case 130. The seal tape 143 seals the seam of the case 130 to prevent leakage when the filter assembly is potted. As shown in FIGS. 14 and 15, the seal tape 143 extends beyond the upper edge of the case 130. Thus, the upper edge portion of the tape 143 forms a cavity for receiving a layer of potting material above the upper edge of the case 130. The potting material covers the upper edges of the case 130, sealing them from environmental conditions such as moisture and dust. Similarly, the seal tape 143 extends beyond the lower edge of the case 130 onto the frame 159 so that the entire outer surface of the case 130 is covered by the seal tape 143.

As shown in FIG. 15, the seal tape 143 has a printed portion 144 that contains the required part identification information. The identification portion 144 may display various specifications for the completed filter assembly. The identification portion 144 is desirably disposed to cover the seam formed by sealing the case to improve the appearance of the filter. Finally, the filter assembly is filled with potting material 146, such as urethane.

It will be appreciated that the EMI filter assemblies of the present invention offer significant space savings because both a common mode inductor and a differential mode inductor are integrated into a single structure. The stacking of filter components within the insulating assembly fixture 128 and the elimination of splice connections further contribute to the compact filter design allowed by the assembly method of the present invention. The structure also requires lower labor costs both in its manufacture and use. In the manufacture, one of the two windings needed to produce a common mode coil, while being wrapped around the common mode core 28 is also wrapped about the differential mode core 32 installed within the structure. This provides a separate magnetic path for the attenuation of differential mode noise. Winding these two together in the same operation eliminates the need for a separate winding operation to wind a differential mode noise inductor. A combined structure also eliminates any need for stocking, installing or connecting a separate differential mode inductor or inductors as part of an EMI filter circuit.

The filter assembly of the present invention also results in reduced heat generation because of the elimination of the heat-producing windings of a separate differential mode inductor. There is consequently a reduced cooling need in the system, and there is a general lowering of the temperature in the system which also helps to improve overall efficiency. The filter assembly of the present invention also has improved performance over prior art filter assemblies because of the elimination of a separate differential mode inductor which reduces the wire length and area that either radiates or receives radiated EMI energy, which can cause coupling deficiencies. It also eliminates resonances between separate inductor elements as they go through phase changes over the frequency range. A further advantage is improved reliability because of the reduced heat, part count and fewer connections.

It will also be appreciated that the EMI filter assemblies of the present invention offer significant space and cost savings because the parts are assembled outside and separate from the case on the insulated assembly fixture 128. Working area or distance between the case and the components to be assembled is not needed since the case is added after the components are assembled. The insulated assembly fixture 128 also assures uniformity of performing since the part location is assured and reproducible. The fixture 128 also saves space and cost since unencapsulated capacitors can be used while their location and performance is protected by the fixture.

It will also be appreciated that the unique laminated and folded case 130 offers significant cost savings, compared to conventional drawn cases and covers while providing an environmentally safe enclosure, radiated EMI shield, and very flexible fabrication method only requiring the relocation of a series of plows and rollers to prepare cases of other sizes.

In view of the above, it will be seen that the several objects of the invention are achieved and other advantageous results are attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method of assembling an electromagnetic interference filter adapted for connection between electrical, electronic or electromechanical equipment the operation of which causes electrical noise, and a power source for said equipment, said filter including a plurality of components comprising at least one inductor and at least one capacitor, the method comprising the steps of:
   (a) disposing said plurality of components on a base;
   (b) connecting said components together to form an electromagnetic interference filter;
   (c) enclosing said filter in a metal case, said metal case being formed by folding a metal sheet having a first end and a second end around said filter and joining said first end to said second end, said metal sheet having an insulating coating disposed on one side thereof to prevent contact between said components and said case; and
   (d) sealing the outer surface of said case with a seal tape.

2. The method of assembling an electromagnetic interference filter of claim 1, further comprising the step of filling said case with potting material.

3. The method of assembling an electromagnetic interference filter of claim 1 wherein said seal tape extends beyond one edge of said case to form a chamber.

4. The method of assembling an electromagnetic interference filter of claim 3, further comprising the step of filling said case with potting material so that said potting material at least partially fills said chamber.

5. The method of assembling an electromagnetic interference filter of claim 1 wherein said seal tape extends beyond one edge of said case to secure said case to said base.

6. The method of assembling an electromagnetic interference filter of claim 1 wherein said base includes a lip for receiving an edge of said case.

7. The method of assembling an electromagnetic interference filter of claim 1 wherein said seal tape includes an information label portion.

8. A method of assembling an electromagnetic interference filter adapted for connection between electrical, electronic or electromechanical equipment the operation of which causes electrical noise, and a power source for said equipment, said filter including a plurality of components comprising at least one inductor and at least one capacitor, at least one of said components having leads, and at least another of said components being an unencapsulated leadless capacitor having a first end and a second end, the method comprising the steps of:
   (a) disposing said plurality of components on an insulated assembly fixture, said insulated assembly fixture being adapted to hold said components securely and having means for positioning said leads of said at least one of said components, said insulated assembly fixture including means for positioning the ends of said unencapsulated leadless capacitor;
   (b) connecting said components together to form an electromagnetic interference filter;
   (c) attaching said insulated assembly fixture to a base;
   (d) enclosing said filter in a case; and
   (e) sealing the outer surface of said case with a seal tape.

9. The method of assembling an electromagnetic interference filter of claim 8 wherein said case is formed by folding a metal sheet having a first end and a second end around said filter and joining said first end to said second end, said metal sheet having an insulating coating disposed on one side thereof to prevent contact between said components and said case.

10. The method of assembling an electromagnetic interference filter of claim 8, further comprising the step of filling said case with potting material.

11. The method of assembling an electromagnetic interference filter of claim 8 wherein said seal tape extends beyond one edge of said case to form a chamber.

12. The method of assembling an electromagnetic interference filter of claim 11, further comprising the step of filling said case with potting material so that said potting material at least partially fills said chamber.

13. The method of assembling an electromagnetic interference filter of claim 8 wherein said seal tape extends beyond one edge of said case to secure said case to said base.

14. The method of assembling an electromagnetic interference filter of claim 8 wherein said base includes a lip for receiving an edge of said case.

15. The method of assembling an electromagnetic interference filter of claim 8 wherein said ends of said unencapsulated leadless capacitor are positioned adjacent to said leads of said at least one of said components.

16. The method of assembling an electromagnetic interference filter of claim 8 wherein said seal tape includes an information label portion.

17. A method of assembling an electromagnetic interference filter adapted for connection between electrical, electronic or electromechanical equipment the operation of which causes noise, and a power source for said equipment, said filter including an inductor having an outer core of permeable material defining an outer window and an inner core of permeable material disposed in said outer window and defining an inner window, said inductor further including a first lead having a first end and a second end, said first lead having a first winding wound about only said outer core, said inductor further including a second lead having a first end and a second end, said second lead having a second winding which is wound about both of said cores to produce an unbalanced field in said inner core in response to differential-mode interference, thereby attenuating said differential-mode interference, said first and second windings being wound to produce a balanced field in said outer core in response to the power current flow in said first and second windings, and to produce an unbalanced field in said outer core in response to common-mode interference, thereby attenuating said common-mode interference, said filter further including a first multiple function integrated capacitor having a first end, a second end and a conductive tab, said filter further including a second capacitor having a first end and a second end, said filter further including a bleeder resistor having a first end and a second end, said filter further including a socket having a first terminal, a second terminal and a third terminal, said filter further including a first conductor, a second conductor and a third conductor, each of said first, second and third conductors having a first end and a second end, the method comprising the steps of:

(a) connecting said first end of said first lead to the first end of said second capacitor and to said second terminal of said socket;

(b) connecting the second end of said first lead to the first end of said second conductor and to the first end of said bleeder resistor and to the first end of said first multiple function integrated capacitor;

(c) connecting said first end of said second lead to the second end of said second capacitor and to said third terminal of said socket;

(d) connecting the second end of said second lead to the first end of said third conductor and to the second end of said bleeder resistor and to the second end of said first multiple function integrated capacitor;

(e) connecting the first end of said first conductor to the first terminal of said socket and to said conductive tab of said first multiple function integrated capacitor.

18. The method of assembling an electromagnetic interference filter of claim 17 further comprising the step of enclosing the filter in a case.

19. The method of assembling an electromagnetic interference filter of claim 18 further comprising the step of connecting said conductive tab of said first multiple function integrated capacitor to said case.

20. The method of assembling an electromagnetic interference filter of claim 18 further comprising the step of sealing said case with seal tape.

21. The method of assembling an electromagnetic interference filter of claim 20 wherein said seal tape extends beyond one edge of said case to form a chamber.

22. The method of assembling an electromagnetic interference filter of claim 21 further comprising the step of filling said case with potting material so that said potting material at least partially fills said chamber.

23. The method of assembling an electromagnetic interference filter of claim 20 wherein said seal tape includes an information label portion.

24. The method of assembling an electromagnetic interference filter of claim 18 further comprising the step of filling the case with potting material.

25. The method of assembling an electromagnetic interference filter of claim 17 wherein the step of connecting the first end of said first conductor to the first terminal of said socket further comprises the substep of installing a single turn bead core on said first conductor.

26. The method of assembling an electromagnetic interference filter of claim 18 wherein the step of connecting the second end of the first lead to the first end of said first multiple function integrated capacitor comprises the substep of forming said first lead into a generally U-shaped channel to receive said first end of said first multiple function integrated capacitor.

27. The method of assembling an electromagnetic interference filter of claim 17 wherein the step of connecting the second end of the second lead to the second end of said first multiple function integrated capacitor comprises the substep of forming said second lead into a generally U-shaped channel to receive said second end of said first multiple function integrated capacitor.

* * * * *